(12) United States Patent
Nattermann et al.

(10) Patent No.: US 6,816,326 B2
(45) Date of Patent: Nov. 9, 2004

(54) OPTICAL SYSTEM WITH COMPENSATED SPATIAL DISPERSION

(75) Inventors: Kurt Nattermann, Ockenheim (DE); Ewald Moersen, Mainz (DE)

(73) Assignee: Schott Glas, Mainz (DE)

( * ) Notice: Subject to any disclaimer, the term of this patent is extended or adjusted under 35 U.S.C. 154(b) by 0 days.

(21) Appl. No.: 10/194,700

(22) Filed: Jul. 12, 2002

(65) Prior Publication Data

US 2004/0008427 A1 Jan. 15, 2004

(51) Int. Cl.[7] ............................. G02B 7/00; G02B 5/30
(52) U.S. Cl. ....................................... 359/822; 359/499
(58) Field of Search ................................. 359/494–502, 359/355, 822, 830

(56) References Cited

U.S. PATENT DOCUMENTS

| | | | |
|---|---|---|---|
| 5,191,387 A | | 3/1993 | Ichikawa et al. |
| 6,084,708 A | | 7/2000 | Schuster |
| 6,141,148 A | | 10/2000 | Becker |
| 6,191,880 B1 | * | 2/2001 | Schuster ..................... 359/238 |
| 2002/0149848 A1 | * | 10/2002 | Labus ......................... 359/500 |
| 2003/0021026 A1 | * | 1/2003 | Allan et al. ................. 359/499 |
| 2003/0086156 A1 | * | 5/2003 | McGuire, Jr. ............... 359/352 |
| 2003/0099047 A1 | * | 5/2003 | Hoffman et al. ............ 359/754 |

FOREIGN PATENT DOCUMENTS

| | | |
|---|---|---|
| EP | 0 834 753 A | 4/1998 |
| EP | 0 942 300 A | 9/1999 |
| WO | 86 03601 A | 6/1986 |

OTHER PUBLICATIONS

Warren J. Smith, Modern Optical Engineering: the Design of Optical Systems, 2nd Ed., 1990, McGraw–Hill, pp. 76–77.*
Merriam–Webster's Collegiate Dictionary, Tenth Edition 2001, p. 557.*
Burnett et al., "Alternative Materials Development (LITJ216) Final Report—Stress Birefringence, Intrinsic Birefringence, and index Properties of 157 nm Refractive Materials," Technology Transfer #02014243A–ENG; International SEMATECH; Feb. 28, 2002.*
Burnett J H et al: "Intrinsic Birefringence . . . " Physical Review, B. Condensed Matter, Americal Institute of Physics, New York, US. BD. 64, NR. 24, Dec. 15, 2001, pp. 241102-1–241102-4.
C. Kittel: "Einfuehrung in Die Festkoerperphysik", 4. Auflage, Oldenbourg, Muenchen, 1976PP 43–47.

* cited by examiner

Primary Examiner—Scott J. Sugarman
Assistant Examiner—Deborah A. Raizen
(74) Attorney, Agent, or Firm—Michael J. Striker

(57) ABSTRACT

The optical system has a first optical element (11,17, 19, 26) and a second optical element (12, 18, 20, 27) having respective plane surfaces and cubic crystal structures, which are arranged next to each other along an optic axis (10) so that one of the crystal axes of each optical element is parallel to the optic axis and the plane surfaces are resting against each other. The first and second optical elements have first and second orientations in relation to the optic axis, which are preferably rotated by a rotation about the optic axis (10) with respect to each other according to the rotational symmetry of the material. At least one of the first optical element and second optical element is pre-stressed by applying a compressive stress ($\sigma, \sigma, 1, \sigma2$) thereto. The compressive stress is applied radially symmetrically in a plane perpendicular to the optic axis (10) and compensates for spatial dispersion.

19 Claims, 4 Drawing Sheets

Compressive forces

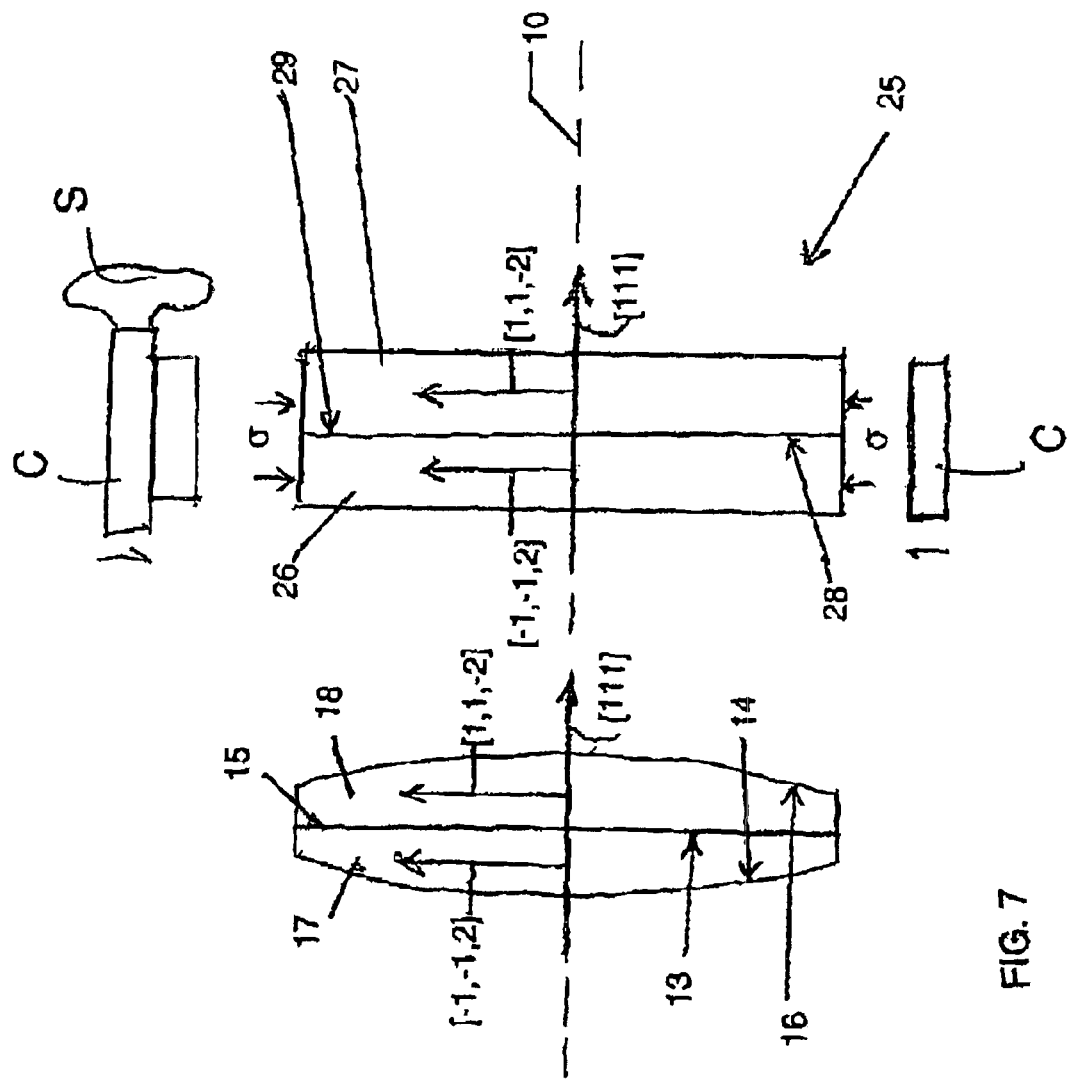

OPTICAL SYSTEM WITH COMPENSATED SPATIAL DISPERSION

BACKGROUND OF THE INVENTION

1. Field of the Invention

The present invention relates to an optical system with compensated spatial dispersion, with an optical axis, with a first optical element, which has a first orientation in relation to the optical axis, and with a second optical element, which has a second orientation in relation to the optical axis, wherein the second orientation is rotated with respect to the first orientation about an angle around the optical axis.

2. Description of the Related Art

Materials for optical systems, such as objectives, lenses, prisms and apparatus including these components and/or elements should be essentially optically isotropic, which means that a light ray or beam passing through them should propagate at the same speed through them in all directions and independently of its polarization. Double refraction or birefringence is a typical sign of different propagation speeds in many crystals. Birefringence usually does not occur in the conventional sense in cubic crystals. However they are optically anisotropic for shorter wavelength radiation. This effect is designated as spatial dispersion and is an intrinsic property of these crystals. A so-called retardation, i.e. a divergence of the wave front, which leads to undesirable interference, occurs because of spatial dispersion, when materials with a cubic crystal structure are used in optical systems. For example, objectives for microlithography are diffraction limited, whereby undesired interference effects lead to poor image production. Shorter wavelength radiation, for example having a wavelength of $\lambda=157$ nm, is used in microlithography. The materials of optical systems that handle this type of short wavelength UV radiation have high or stringent specifications. This short wave radiation can destroy unsuitable materials. For this reason $CaF_2$ is preferred as the material for optical systems used in microlithograph, so that sufficient transmission can be obtained for energetic radiation at these comparatively shorter wavelengths. According to J. H. Burnett, Z. H. Levine, E. Shirley: "Intrinsic Birefringence in Calcium Fluoride and Barium Fluoride", Phys. Rev. B64, 241102(R), 2001, the retardation called for by the spatial dispersion for a wavelength of $\lambda=157$ nm for [110] radiation in a $CaF_2$ crystal amounts to about 11.5 nm/cm. Objectives for microlithography require a retardation of <1 nm/cm because they are diffraction limited. For this reason an optical system is desired, whose spatial dispersion can be limited to a retardation <1 nm/cm, so that for example $CaF_2$ can be used as the material for the optical system for 157-nm radiation in microlithography.

The path differences of the individual rays caused by spatial dispersion differ for different radiation propagation directions in the crystal. It is possible to compensate spatial dispersion, for example, when the propagation direction of a ray in a first optical element is along a so-called rapid axis, which means an axis along which the propagation speed is higher, and in a second optical element along a so-called slow axis, which means an axis along which the propagation speed is reduced. The retardation caused by spatial dispersion is thus compensated in this way, however the compensation is still comparatively insufficient. The residual retardation due to the spatial dispersion always still leads to undesirably large imperfections in the imaging properties of the optical system.

SUMMARY OF THE INVENTION

It is an object of the present invention to provide an optical system with elements made from materials with cubic crystal structure, whose spatial dispersion is efficiently compensated, so that only a reduced optical retardation results due to the spatial dispersion.

This object, and others which will be made more apparent hereinafter, are attained by in an optical system having a first optical element and a second optical element arranged along an optic axis, wherein the first optical element has a first orientation in relation to the optic axis and the second optical element has a second orientation in relation to the optic axis.

According to the invention at least one of the first optical element and second optical element is pre-stressed with a compressive stress in a radial symmetric manner with respect to the optic axis in order to compensate for the spatial dispersion. This compressive stress is produced by forces, which are perpendicular to the optic axis and distributed uniformly around the circumference or the optical element.

A stress birefringence may be produced by this compressive stress, which is superimposed on the spatial dispersion. In this way the positions of the fast axis and the slow axis as well as the difference of the propagation speeds occurring on these axes change. Thus the retardation produced by one optical element may be adjusted in this way so that it nearly completely cancels the retardation produced by the other optical element. The size of the required compressive stress may be determined either by experiment, or can be calculated. For this purpose, for example, a so-called ray tracing is performed. Also a commercial ray tracing program, namely Code V of Optical Research Associates, 3280 East Foothill Blvd., Pasadena, Calif., 91197, U.S.A, so that fewer optical stress corrections are necessary.

In a preferred embodiment of the invention the compressive stress is substantially uniform and isotropic. Furthermore the forces exerted by the compressive stress on the optical element are uniform, for example inwardly directed radial symmetric on the outer periphery of a lens. The compressive stress should amount to from 0.5 to 50 MPa, preferably 0.6 to 1.6 MPa.

The first optical element and/or the second optical element should be pre-stressed in a uniform plane stressed state in a plane perpendicular to the optic axis and of course in a radial plane perpendicular to the optic axis in order to provide simpler control and improved computability of the system. This planar stressed state may be produced reproducibly by application of a uniform inwardly directed compressive stress on the periphery.

A stress-producing apparatus is usually used to produce the compressive stress. This stress-producing apparatus usually comprises a collection of devices, which uniformly exert the compressive force on the optical element, especially in a radial direction toward the optic axis. Usual apparatus includes e.g. a clamping ring, a hydrostatic ring, which surrounds the element, such as a tube, or other conventional means, used for producing e.g. an isostatic pressure.

A clamping ring is a device, which produces the radial compressive stress, especially easily. For example, the outer peripheral surface of a lens can be pressed inwardly by means of this clamping ring, so that the clamping or compressive forces act in a radial direction toward the optic axis. It is advantageous when adjusting means for adjusting the compressive force are present. By means of these adjusting means the desired value can be set. Especially during experimental determination of the required compressive stress the compressive stress should adjust the remaining retardation to a minimum value.

In other embodiments of the invention the first optical element is pre-stressed with a first compressive stress and the second optical element is pre-stressed with a second compressive stress different from the first. Thus the retardation of both optical elements can be compensated especially effectively with respect to each other by this pre-stressing with different compressive stresses.

Preferably the material has a cubic crystal structure, such as $CaF_2$ or $BaF_2$. These crystals have especially desirable properties, particular for short wavelength radiation. $MgF_2$ also provides good transmission for short wave radiation.

In the arrangement according to the invention the first and second optical elements have a first and second orientation with first and second axes, which can be both the same and also different, and which can extend parallel to each other or also at an angle to each other. Thus it is of additional advantage, when a so-called fast axis of the first orientation is correlated to or switched with a so-called slow axis of the second orientation. In this case the fast propagation of the wave front in the first optical element along the fast axis can be compensated and/or switched by a slow propagation in the second optical element along the associated slow axis.

In a preferred embodiment according to the invention the optical elements are rotated against each other about the optic axis according to their rotational symmetry in relation to the optic axis. The rotation angle preferably is half the symmetry rotation angle of the material, from which the optical elements are made, or an odd multiple of it, at the respective orientations. In a material with a three-fold symmetry amounting to a symmetry angle 120°, i.e. the elements should be twisted relative to each other by about half of this angle, thus 60° or a 3-fold, 5-fold, 7-fold multiple of it. In a material with an n-fold rotational symmetry with respect to the optic axis, the symmetry angle is 360°/n. As a result the elements should be rotatably offset against each other by about 0.5*{360°/n} or an odd multiple of this value.

An advantageous embodiment of the optical system of the invention results when the angle about the optical axis in the first orientation amounts to 45°, 135°, 225° or 315° when the material has a four fold symmetry. This, for example, is the case in a $CaF_2$ crystal when the [100]-, [010]-, [001]-axes are parallel to the optic axis in the first orientation and the second orientation. In this case the (100)-, (010)- and (001)-surfaces of the $CaF_2$ crystal are arranged perpendicular to the optic axis. A rotation about an angle of 90° or a multiple of that leads then again to an equivalent arrangement of the crystal and thus the slow axis and the fast axis.

In a crystal with a three-fold rotational symmetry of the material the angle for rotation or twisting about the optic axis should be 60°, 180° or 300° in the first orientation. This is then the case when the [111]-, [-1-11]-, [1-11]-axes in the first orientation and the second orientation are parallel to the optical axis. In this case the (111)-, (-1-11)- and (1-11)-surfaces of the crystal are arranged at right angles to the optic axis. A rotation about 120°, or a multiple of it, leads then to an equivalent origination of the crystal and thus the slow axis and the fast axis.

In a further embodiment of the invention the first optical element and the second optical element have respective surfaces, which are plane/plane or convex/concave or concave/convex and are facing each other. It is however also possible in another embodiment that the facing surfaces are plane/concave or plane/convex. When the facing surfaces are plane relative to each other both optical elements, for example, can be formed as two halves of a convex-convex lens. An inexpensive lens group can be formed by a convex/concave structure or a concave/convex structure. The optical elements can be rigidly connection with other or separated by a gap.

Preferably the first optical element and the second optical element form the end group of an objective. In this embodiment this end group thus compensates for the retardation of the entire system. No other image errors can occur from the end group to the point at which the image forms.

It is also possible that the first optical element and the second optical element form a planar corrective system or component. In this case conventional optics are used, which the first optical element and the second optical element forming the planar corrective system follow. This embodiment is especially preferred when the first optical element and the second optical element are plane layers or disks of equal thickness. A corrective platelet or component thus formed may be simply mounted and simply and easily put in the stressed state.

BRIEF DESCRIPTION OF THE DRAWING

The objects, features and advantages of the invention will now be described in more detail with the aid of the following description of the preferred embodiments, with reference to the accompanying figures in which:

FIG. 7 is a sectional view through an additional embodiment of an optical system that includes a lens and a corrective plate according to the invention.

DETAILED DESCRIPTION OF THE INVENTION

Figure 1:
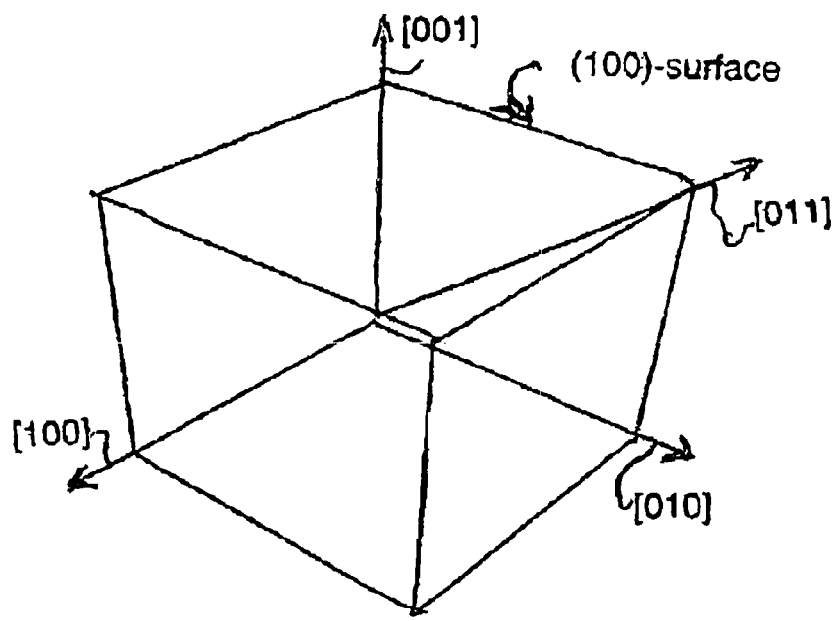
FIG. 1 is a diagrammatic perspective view of a cubic crystal illustrating the crystal axes and crystal surfaces.

FIG. 1 shows a schematic perspective illustration of a crystal with a cubic crystal structure for illustration of the crystal axes and crystal surfaces. It is prepared according to the usual convention for the definition of crystal axes e.g. found in C. Kittel, "Introduction to Solid State Physics", $4^{th}$ Edition, Oldenbourg, München, 1976. The directions [100], [010] and [001] are illustrated in this figure. Furthermore the (100)-surface is illustrated. The direction vector [100] is shown extending perpendicular to this surface. In addition the direction vector [011], which extends at a 45° angle to the direction vectors [010] and [001], is also illustrated in this figure.

Figure 2:
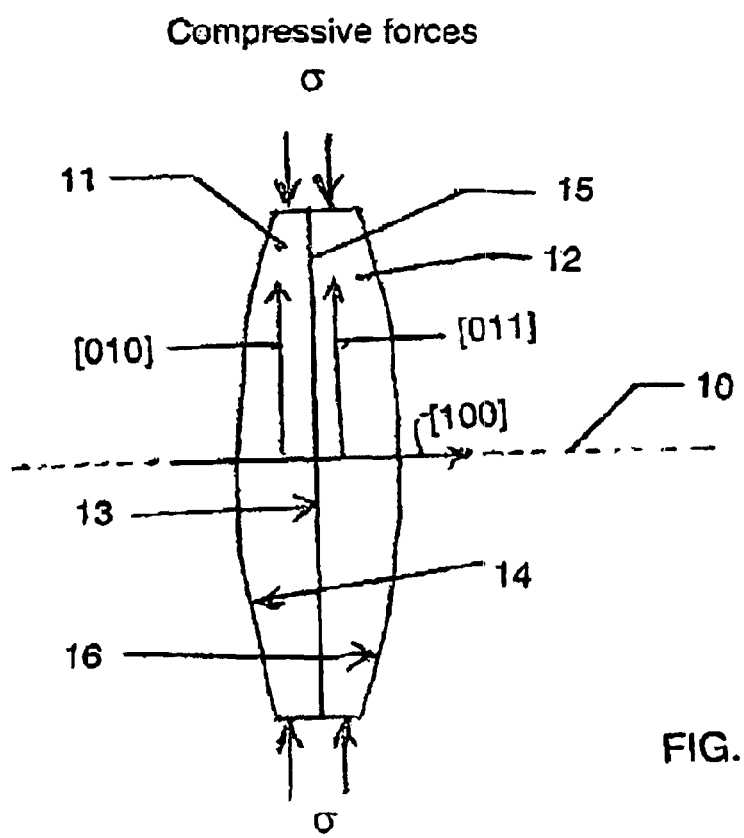
FIG. 2 is a meridian sectional view through a first embodiment of an optical system according to the invention.

FIG. 2 shows an optical system with an optic axis 10 in a first embodiment of the invention. The illustrated optical system has a first optical element 11 and a second optical element 12. In the illustrated embodiment the first optical element 11 and the second optical element 12 are made from $CaF_2$ crystalline material. Their respective (100) surfaces are arranged at right angles to the optical axis 10. This means that their axes [100] are parallel to the optic axis 10. The first optical element 11 has a plane surface 13 and a curved surface 14 and is a piano-convex lens. The second optical element similar has a plane surface 15 and a curved surface 16 and is similarly a piano-convex lens. The plane surfaces 13, 15 are facing each other and rest against each other, without any intervening space between them. In the illustrated embodiment they can be glued together if necessary. The plane surfaces 13, 15 are perpendicular to the optic axis. In this way the first optical element 11 and the second optical element 12 form a biconvex lens, which is illustrated in the meridian view shown in FIG. 2. The path of the rays is from left to right or the reverse in FIG. 2. The diameter of the first optical element 11 and the second optical element 12 amounts to e.g. 15 mm. The curvature of the curved surfaces 14, 16 amounts to e.g. 500 mm.

As shown in the figure, the [010]-crystal axis of the first optical element 11 extends upward at right angles to the optical axis 10 in the figure in the plane in which the figure is arranged (plane of the paper). The crystal orientation of the second optical element 12 is in contrast rotated or twisted around the optic axis 10 about 45° relative to that of the first optical element 11. This is clearly the situation because, as shown in the figure, the [011]-crystal axis extends upward in the plane of the paper and is perpendicular to the optic axis 10. The first optical element 11 and the second optical element 12 together form an optical system in the form of a rotationally symmetric body. Inwardly directed compressive stress σ is applied at the outer peripheral surfaces of the first and second optical elements 11,12. This compressive stress σ can be applied by means of a clamping ring C arranged around the lens circumference (shown not tightened and diagrammatically or formally in FIG. 7). In this way the compressive stress σ is transmitted uniformly to the outer periphery of the optical elements. Radially isotropic and homogeneous stress is thus developed in the first optical element 11 and the second optical element 12.

When a ray with a wavelength of 157 nm travels from left along the optic axis 10 and impinges on curved surface 14 of the first optical element 11 in the optical system of FIG. 2 with a diameter of D=80 mm and an opening angle of 2 $\theta_{MAX}$=106°, then a maximum phase difference of 6° results with a numerical aperture of NA=0.8 through the first and second optical elements 11,12 when the compressive stress σ is −1.35 MPa. When one compares this value with a resulting phase difference of 50° without application of any compressive stress (σ=0), a reduction to only about 12% of the value without compressive stress results by applying the above compressive stress.

Similar values then result, when the [010]-axis or [001]-axis of the first optical element 112 and the second optical element 12 are arranged parallel to the optic axis 10 and the second optical element 12 is twisted or rotated around the optical axis about 45° relative to the first optical axis 11. Furthermore the rotation angles of 135°, 225° or 315° are also possible instead of the angle 45°. The plane surfaces 13,15 need not be glued together, but also can have a gap or intervening space between them.

Figure 3:
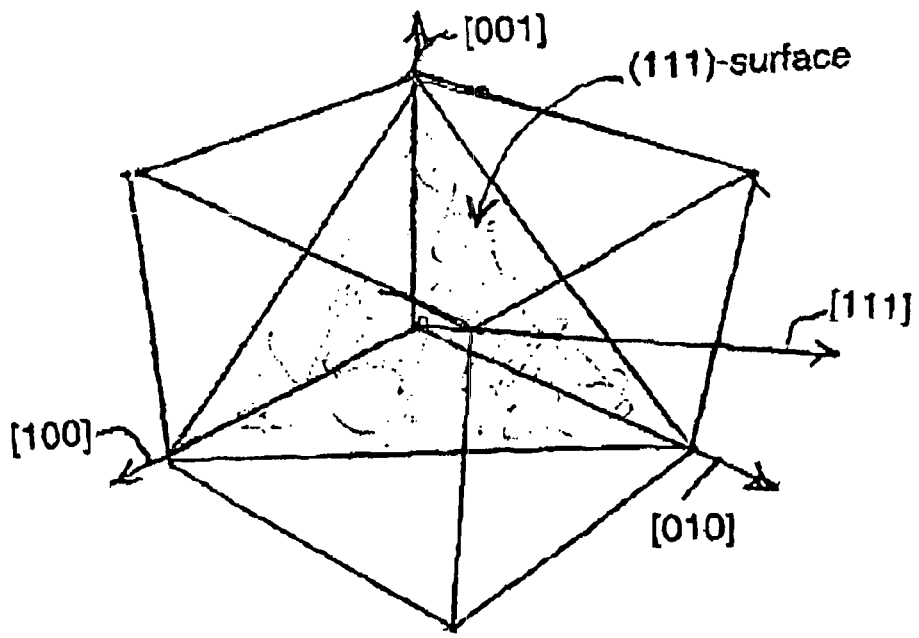
FIG. 3 is a diagrammatic perspective view similar to FIG. 1 illustrating the position of a (111) surface.

FIG. 3 shows a similar perspective view as in FIG. 1, in which a (111)-surface as well as a [111] direction is shown. The [111]-direction vector extends as a space diagonal in the cubic structure described by the direction vectors [100], [001] and [010]. It is perpendicular to the (111)-surface.

Figure 4:
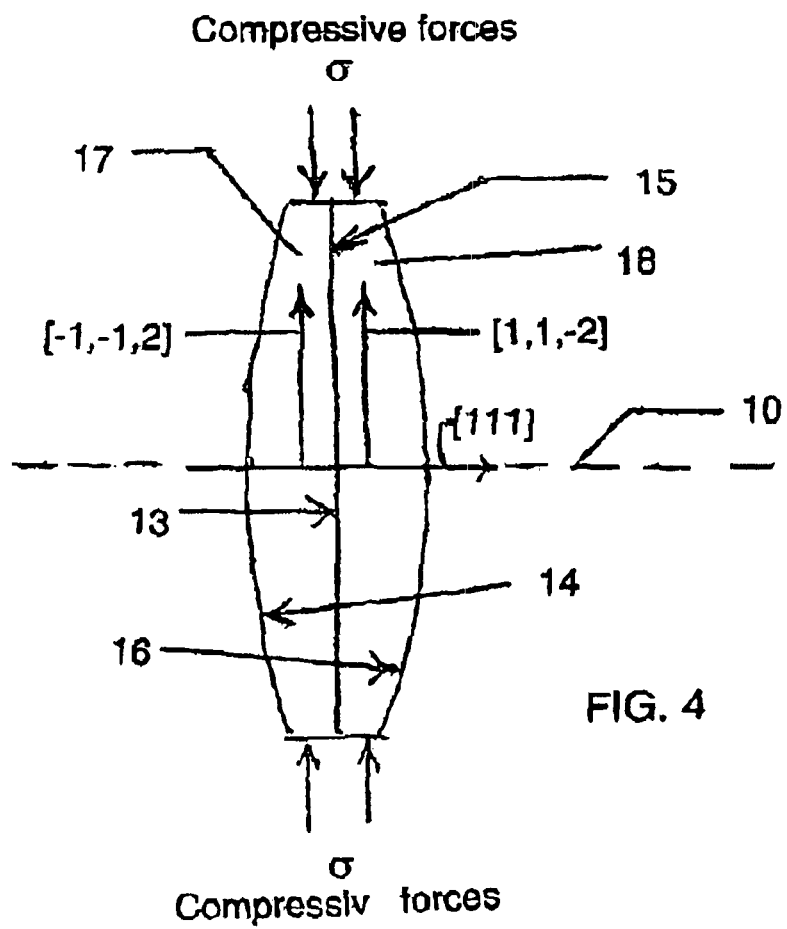
FIG. 4 is a meridian sectional view through a second embodiment of an optical system according to the invention.

In FIG. 4 a second embodiment of the optical system according to the invention is shown. The optical system has a first optical element 17 and a second optical element 18 similar to the first optical element 11 and the second optical element 12 of FIG. 2. The same features or elements in the embodiments of the optical system are provided with the same reference numbers in the figures. The first optical element 17 and the second optical element 18 differ from the first optical element 11 and the second optical element 12 because of differing crystal orientation.

Figure 5:
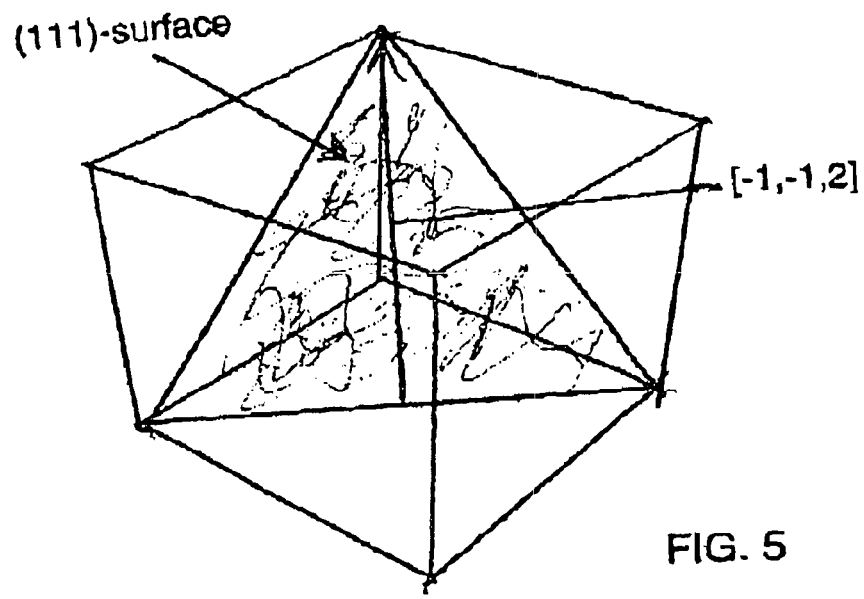
FIG. 5 is a diagrammatic perspective view similar to FIG. 3 illustrating the [-1,-1, 2]-axis.

In the first optical element 17 and the second optical element 18 the [1,1,1]-direction is parallel to the optic axis 10. In the first optical element 17 the [-1,-1,2] direction is perpendicular to the optic axis 10 and extends upward in the plane of the paper in which the figure lies. As shown in FIG. 5, the [-1,-1,2] direction is parallel to the (111)-surface and points upward in FIG. 5. In contrast in the second optical element 18 the [1,1,-2] direction is perpendicular to the optic axis 10 and is arranged pointing perpendicularly upward in the plane of the paper. In FIG. 5 the [1,1,-2] direction is parallel to the [-1,-1,2] direction, however it points in the opposite direction. The second optical element 18 is thus twisted or rotated about the optic axis 180° relative to the first optical element 17.

When the compressive stress σ is −1.7 MPa a maximum phase difference of about 4.5° results with the same preconditions that the radiation beam has a wavelength of 157 nm and travel from left to right in the figure and with D=80 mm, an angular range 2 $\theta_{MAX}$=106°, and a numerical aperture NA=0.8.

This maximum phase difference amounts to only about 13% of the phase difference values without compressive stress.

The same results is thus obtained when the [-1,1,1]-, [-1,-1,1]- or [1,-1,1] direction is parallel to the optic axis 10 in the first optical element 17 and the second optical element 18 instead of the [1,1,1]-direction and the second optical element 18 is rotated or twisted about 180° relative to the first optical element 17. The same effect is obtained also with rotation of the second optical element 18 about the optic axis 10 of 60° or 300° relative to the first optical element 17.

Figure 6:
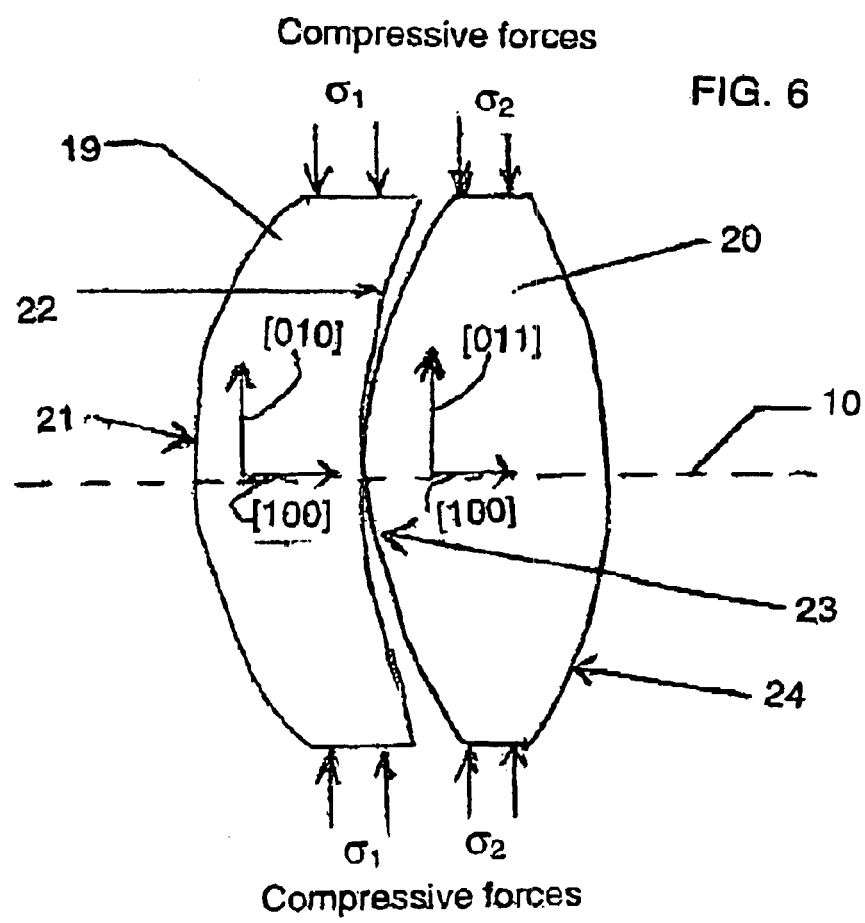
FIG. 6 is a sectional view through a third embodiment of an optical system according to the invention.

FIG. 6 shows a third embodiment of an optical system according to the invention. The crystal orientation of the first optical element 19 and the second optical element 20 corresponds to that of the first optical element 11 and the second optical element 12 of the first embodiment shown in FIG. 2. The first optical element 19 is a concave-convex lens with a convex surface 21 and a concave surface 22. The curvature radius of the convex surface 21 amounts to 750 mm. The curvature radius of the concave surface 22 amounts to 1.000 mm. The thickness of the first optical element 19 amounts to 15 mm in the vicinity of the optic axis 10. The second optical element 20 is a biconvex lens with a first convex surface 23 and a second convex surface 24. Each of the convex surfaces 23,24 has a curvature radius of 500 mm. The second optical element 20 has a thickness of 30 mm. The first optical element 19 and the second optical element 20 each have a diameter of 100 mm. The first convex surface 23 is facing the concave surface 22. In this way the first convex surface 23 is arranged almost in the depression formed by the concave surface 22.

The first optical element 19 is subjected to a uniform first compressive stress σ1 on its outer circumference. The second optical element 20 is subjected to a uniform second compressive stress σ2 on its outer circumference. The maximum phase difference amounts to about 7° with a first compressive stress σ1=40 MPa and a second compressive stress σ2=−1.0 MPa for rays or beams with wavelengths of 157 nm impinging on concave surface 22 and with D=80 mm, an angular range of 2 $\theta_{MAX}$=106°, so that the numerical aperture NA=0.8. This corresponds to less than 10% of the maximum phase difference of about 88°.

FIG. 7 shows an additional embodiment of the optical system with the inventive features. The optical system has the lenses consisting of the first optical element 17 and the second optical element 18 of FIG. 4, which are followed by a downstream or following planar corrective system 25. This planar corrective system or component 25 has a first optical element 26 and a second optical element 27, which are formed as planar disks. The first optical element 26 and the second optical element 27 are made from CaF$_2$ crystals, In which the [111]-axes of the first optical element 26 and the second optical element 27 are parallel to the optic axis 10. The first optical element 26 has a plane surface 28 and the second optical element 27 has a plane surface 29, which faces and contacts the plane surface 28, as shown in FIG. 7. The [-1,-1,2] direction of the first optical element 26 is perpendicular to the [111] direction arranged directed upward in the plane of the paper in which the figure extends. In contrast the orientation of the second optical element 27 is twisted or rotated around the [111] direction about 180°, whereby the [11,-2]-direction is perpendicular to the [111] direction and points upwards in the plane of the paper.

In the embodiment of FIG. 7 compressive stress σ is applied to the first and second optical elements 26,27 by the formally illustrated clamp C. The compressive stress σ applied to the optical elements is adjustable by means of the adjusting screw S of the clamp C.

If a radiation beam with a wavelength of 157 nm is guided through the optical system of FIG. 7 and impinges on curved surface 14 and with D=80 mm and an angular range 2 $\theta_{MAX}$=106°, so that the numerical aperture NA of the optical system amounts to 0.8, the maximum phase difference amounts to 6° with a compressive stress σ=−6.3 MPa on the corrective element 25. This corresponds to a reduction of the maximum phase difference of 50° that is obtained without the compressive stress to about 12% of the maximum phase difference.

While the invention has been illustrated and described as embodied in an optical system with compensated spatial dispersion, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

We claim:

1. An optical system with compensated spatial dispersion, said optical system comprising a first optical element (11, 17, 19, 26) having a plane surface and a cubic crystal structure with a plurality of crystal axes and a second optical element (12, 18, 20, 27) having a plane surface and a cubic crystal structure with a plurality of crystal axes, and said first optical element and said second optical element are arranged along an optic axis (10) with said plane surface of said first optical element facing and resting against said plane surface of said second optical element, wherein the cubic crystal structure of the first optical element has a first orientation in relation to the optic axis, in which one of the crystal axes of the crystal structure of the first optical element is parallel to the optic axis, and the cubic crystal structure of the second optical element has a second orientation in relation to the optic axis, in which one of the crystal axes of the crystal structure of the second optical element is parallel to the optic axis, said second orientation being different from said if first orientation, wherein at least one of the first optical element and second optical element is pre-stressed by applying a compressive stress (σ,σ1,σ2) thereto and said compressive stress is applied radially symmetrically relative to the optic axis (10) in order to compensate for the spatial dispersion.

2. The optical system as defined in claim 1, wherein said compressive stress (σ,σ1, σ2) is isotropic and homogeneous.

3. The optical system as defined in claim 1, wherein said compressive stress (σ,σ1,σ2) is from 0.5 to 50 MPa.

4. The optical system as defined in claim 1, wherein said compressive stress is from 0.6 to 1.6 MPa.

5. The optical system as defined in claim 1, wherein said at least one of the first optical element and second optical element is in a planar pre-stressed state in a plane perpendicular to the optic axis (10).

6. The optical system as defined in claim 1, further comprising means (C) for producing said compressive stress (σ,σ1,σ2).

7. The optical system as defined in claim 1, further comprising means (C) for producing said compressive stress (σ,σ1,σ2) and means (S) for adjusting said compressive stress.

8. The optical system as defined in claim 1, wherein said compressive stress (σ,σ1,σ2) includes a first compressive stress (σ1) applied to said first optical element and a second compressive stress (σ2) applied to said second optical element.

9. The optical system as defined in claim 1, wherein said first optical element and said second optical element are made from a crystalline material and said crystalline material is CaF$_2$ or BaF$_2$.

10. An optical system with compensated spatial dispersion, said optical system comprising a first optical element (11, 17, 19, 26) having a plane surface and a cubic crystal structure with a plurality of crystal axes and a second optical element (12, 18, 20, 27) having a plane surface and a cubic crystal structure with a plurality of crystal axes, and said first optical element and said second optical element are arranged along an optic axis with said plane surface of said first optical element facing and resting against said plane surface of said second optical element, wherein the cubic crystal structure of the first optical element has a first orientation in relation to the optic axis, in which one of the crystal axes of the first optical element is parallel to the optic axis, and the cubic crystal structure of the second optical element has a second orientation in relation to the optic axis, in which one of the crystal axes of the second optical element is parallel to the optic axis, said second orientation being different from said first orientation, wherein at least one of the first optical element and second optical element is pre-stressed by applying a compressive stress (σ,σ1,σ2) thereto and said compressive stress is applied radially symmetrically relative to the optic axis (10) in order to compensate for the spatial dispersion; wherein said first optical element has a slow axis, said second optical element has a fast axis and said fast axis coincides with said slow axis.

11. An optical system with compensated spatial dispersion, said optical system comprising a first optical element (11, 17, 19, 26) having a plane surface and a cubic crystal structure with a plurality of crystal axes and a second optical element (12, 18, 20, 27) having a plane surface and a cubic crystal structure with a plurality of crystal axes, and said first optical element and said second optical element are arranged along an optic axis (10) with said plane surface of said first optical element facing and resting against said plane surface of said second optical element, wherein the cubic crystal structure of the first optical element has a first orientation in relation to the optic axis, in which one of the crystal axes of the first optical element is parallel to the optic axis, and the cubic crystal structure of the second optical element has a second orientation in relation to the optic axis, in which one of the crystal axes of the second optical element is parallel to the optic axis, said second orientation being different from said first orientation, wherein at least one of the first optical element and second optical element is pre-stressed by applying a compressive stress (σ,σ1,σ2) thereto and said compressive stress is applied radially symmetrically relative to the optic axis (10) in order to compensate for the spatial dispersion; wherein said first optical element has a slow axis, said second optical element has a fast axis and said fast axis is directed in a direction opposite from that of said slow axis.

12. An optical system with compensated spatial dispersion, said optical system comprising a first optical element (11, 17,19, 26) having a plane surface and a cubic crystal structure with a plurality of crystal axes and a second optical element (12, 18, 20, 27) having a plane surface and a cubic crystal structure with a plurality of crystal axes, and said first optical element and said second optical element are arranged along an optic axis (10) with said plane surface of said first optical element facing and resting against said plane surface of said second optical element, wherein the cubic crystal structure of the first optical element has a first orientation in relation to the optic axis, in which one of the crystal axes of the first optical element is parallel to the optic axis, and the cubic crystal structure of the second optical element has a second orientation in relation to the optic axis, in which one of the crystal axes of the second optical element is parallel to the optic axis, said second orientation being different from said first orientation, wherein at least one of the first optical element and second optical element is pre-stressed by applying a compressive stress (σ,σ1,σ2) thereto and said compressive stress is applied radially symmetrically relative to the optic axis (10) in order to compensate for the spatial dispersion; wherein the first and second optical elements are made from a crystalline material with a four-fold rotational symmetry and said first optical element and said second optical element are twisted or rotated about the optic axis (10) relative to each other by a rotation angle of 45°, 135°225° or 315°.

13. An optical system with compensated spatial dispersion, said optical system comprising a first optical element (11, 17, 19, 28) having a plane surface and a cubic crystal structure with a plurality of crystal axes and a second optical element (12, 18, 20, 27) having a plane surface and a cubic crystal structure with a plurality of crystal axes, and said first optical element and said second optical element are arranged along an optic axis (10) with said plane surface of said first optical element facing and resting against said plane surface of said second optical element, wherein the cubic crystal structure of the first optical element has a first orientation in relation to the optic axis, in which one of the crystal axes of the first optical element is parallel to the optic axis, and the cubic crystal structure of the second optical element has a second orientation in relation to the optic axis, in which one of the crystal axes of the second optical element is parallel to the optic axis, said second orientation being different from said first orientation, wherein at least one of the first optical element and second optical element is pre-stressed by applying a compressive stress (σ,σ1,σ2) thereto and said compressive stress is applied radially symmetrically relative to the optic axis (10) in order to compensate for the spatial dispersion; wherein the first and second optical elements are made from a crystalline material with a three-fold rotational symmetry and said first optical element and said second optical element are twisted or rotated about the optic axis (10) relative to each other by a rotation angle of 60°, 180° or 300°.

14. The optical system as defined in claim 1, wherein the cubic crystal structures of said first and second optical elements each have a [100]-axis, a [010]-axis, a [111]-axis, a [1-11]-axis, a [-1-11]-axis and wherein said [100]-axis, said [010]-axis, said [001]-axis, said [111]-axis, said [-1-11]-axis or said [1-11]-axis is parallel to the optic axis (10).

15. The optical system as defined In claim 1, wherein said first optical element and said second optical element are arranged on said optic axis to form an end group of an objective.

16. An optical system with compensated spatial dispersion, said optical system comprising a first optical element (11, 17, 19, 26) having a cubic crystal structure with a plurality of crystal axes and second optical element (12, 18, 20, 27) having a cubic crystal structure with a plurality of crystal axes, and said first optical element and said second optical element are arranged along an onto axis (10), wherein the cubic crystal structure of the first optical element has a first orientation in relation to the optic axis, in which one of the crystal axes of the crystal structure of the first optical element is parallel to the optic axis, and the cubic crystal structure of the second optical element has a second orientation in relation to the optic axis, in which one of the crystal axes of the crystal structure of the second optical element is parallel to the optic axis, said second orientation being different from said first orientation, wherein at least one of the first optical element and second optical element is pre-stressed by applying a compressive stress (σ,σ1,σ2) thereto and said compressive stress is applied radially symmetrically relative to the optic axis (10) in order to compensate for the spatial dispersion: wherein said first optical element and said second optical element are arranged on said optic axis to form a planar corrective system.

17. The optical system as defined in claim 1, wherein said first optical element and said second optical element have equal thickness.

18. An apparatus comprising
an optical device with compensated spatial dispersion, said optical device including a first optical element (11, 17, 19 ,26) having a plane surface and a cubic crystal structure with a plurality of crystal axes and a second optical element (12, 18, 20, 27) having a plane surface and a cubic crystal structure with a plurality of crystal axes, wherein said first optical element and said second optical element are arranged along an optic axis (10) with said plane surface of said first optical element facing and resting against said plane surface of said second optical element, wherein the cubic crystal structure of the first optical element has a first orientation in relation to the optic axis, in which one of the crystal axes of the first optical element is parallel to the optic axis, and the cubic crystal structure of the second optical element has a second orientation in relation to the optic axis, in which one of the crystal axes of the second optical element is parallel to the optic axis, said second orientation being different from said first orientation, wherein at least one of the first optical element and second optical element is pre-stressed by applying a compressive stress (σ,σ1,σ2) thereto and said compressive stress is applied radially symmetrically relative to the optic axis (10) in order to compensate for the spatial dispersion; and at least one of a lens, a prism, a light conducting rod, an optical window, an optical component for DUV-photolithography, a stepper and an excimer laser.

19. An apparatus comprising a computer chip, an integrated circuit or an electronic unit and including an optical device with compensated spatial dispersion, said optical device including a first optical element (11, 17, 19, 28) having a plane surface and a cubic crystal structure with a plurality of crystal axes and a second optical element (12, 18, 20, 27) having a plane surface and a cubic crystal structure with a plurality of crystal axes, wherein said first optical element and said second optical element are arranged along an optic axis (10) with said plane surface of said first optical element facing and resting against said plane surface of said second optical element, wherein the cubic crystal structure of the first optical element has a first orientation in relation to the optic axis, in which one of the crystal axes of the first optical element is parallel to the optic axis, and the cubic crystal structure of the second optical element has a second orientation in relation to the optic axis, in which one of the crystal axes of the second optical element is parallel to the optic axis, said second orientation being different from said first orientation, wherein at least one of the first optical element and second optical element is pre-stressed by applying a compressive stress (σ,σ1,σ2) thereto and said compressive stress is applied radially symmetrically relative to the optic axis (10) in order to compensate for the spatial dispersion.

* * * * *